US010777444B2

(12) United States Patent
Santos Rodriguez et al.

(10) Patent No.: US 10,777,444 B2
(45) Date of Patent: *Sep. 15, 2020

(54) WAFER ARRANGEMENT AND METHOD FOR PROCESSING A WAFER

(71) Applicant: Infineon Technologies AG, Neubiberg (DE)

(72) Inventors: Francisco Javier Santos Rodriguez, Villach (AT); Gerald Lackner, Arnoldstein (AT); Josef Unterweger, Annenheim (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 56 days.

This patent is subject to a terminal disclaimer.

(21) Appl. No.: 15/951,213

(22) Filed: Apr. 12, 2018

(65) Prior Publication Data

US 2018/0261487 A1    Sep. 13, 2018

Related U.S. Application Data

(63) Continuation of application No. 14/490,705, filed on Sep. 19, 2014, now Pat. No. 9,966,293.

(51) Int. Cl.
*B65D 85/02* (2006.01)
*H01L 21/683* (2006.01)
*H01L 21/304* (2006.01)
*H01L 21/673* (2006.01)

(52) U.S. Cl.
CPC ........ *H01L 21/6835* (2013.01); *H01L 21/304* (2013.01); *H01L 21/67369* (2013.01); *H01L 2221/6834* (2013.01); *H01L 2221/68318* (2013.01); *H01L 2221/68381* (2013.01)

(58) Field of Classification Search
CPC ........ H01L 21/67346; H01L 21/67369; B65D 85/02
USPC .............. 206/710, 308.1, 309, 307, 303
See application file for complete search history.

(56) References Cited

U.S. PATENT DOCUMENTS

| | | | | |
|---|---|---|---|---|
| 4,856,766 A * | 8/1989 | Huberts | ........... | G03F 7/707 269/21 |
| 6,981,594 B1 * | 1/2006 | Sarver | ........... | H01L 21/6732 206/445 |
| 7,624,870 B2 * | 12/2009 | Nishizaka | ......... | H01L 21/67353 206/303 |
| 2010/0224517 A1 * | 9/2010 | Haggard | ........... | H01L 21/67369 206/308.1 |
| 2012/0205282 A1 * | 8/2012 | Pylant | ............... | H01L 21/67369 206/592 |

* cited by examiner

*Primary Examiner* — King M Chu
(74) *Attorney, Agent, or Firm* — Viering, Jentschura & Partner MBB

(57) ABSTRACT

A wafer arrangement in accordance with various embodiments may include: a wafer; and a wafer support ring, wherein the wafer and the wafer support ring are configured to be releasably coupled to one another so that the wafer support ring can be uncoupled from the wafer without causing damage to the wafer or the wafer support ring.

20 Claims, 10 Drawing Sheets

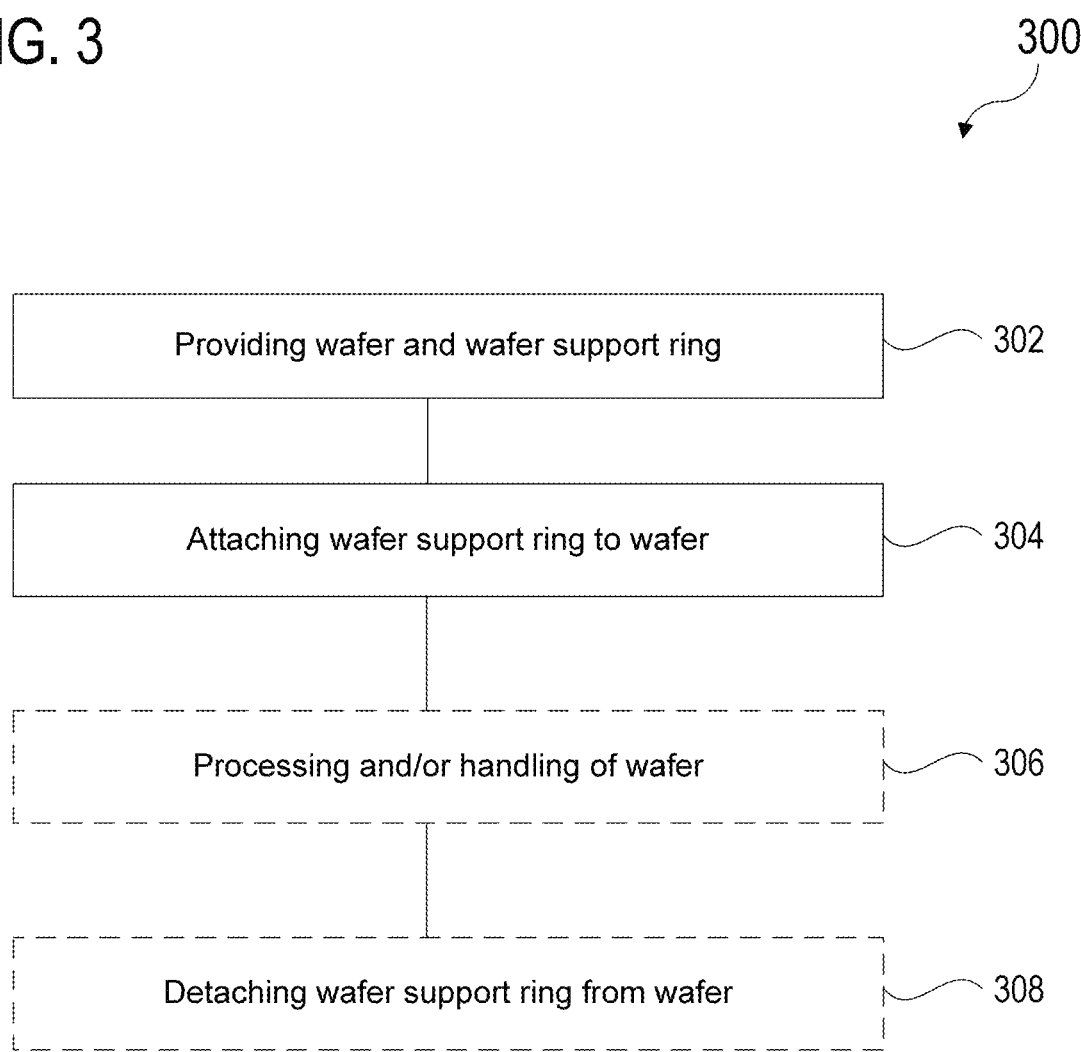

WAFER ARRANGEMENT AND METHOD FOR PROCESSING A WAFER

CROSS-REFERENCE TO RELATED APPLICATIONS

This application is a continuation of U.S. patent application Ser. No. 14/490,705, filed Sep. 19, 2014, the contents of which are incorporated by reference.

TECHNICAL FIELD

Various embodiments relate to a wafer arrangement and a method for processing a wafer.

BACKGROUND

Semiconductor chips are usually fabricated from semiconductor wafers. Handling and/or processing of thin wafers may be difficult as the wafers may be susceptible to, e.g., warpage and/or breakage. Mechanical stability of the wafers may need to be increased for safe handling and/or processing of the wafers.

SUMMARY

In accordance with various embodiments, a wafer arrangement may include: a wafer; and a wafer support ring, wherein the wafer and the wafer support ring are configured to be releasably attachable to one another.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a method for processing a wafer in accordance with various embodiments;

DESCRIPTION

Figure 1A:
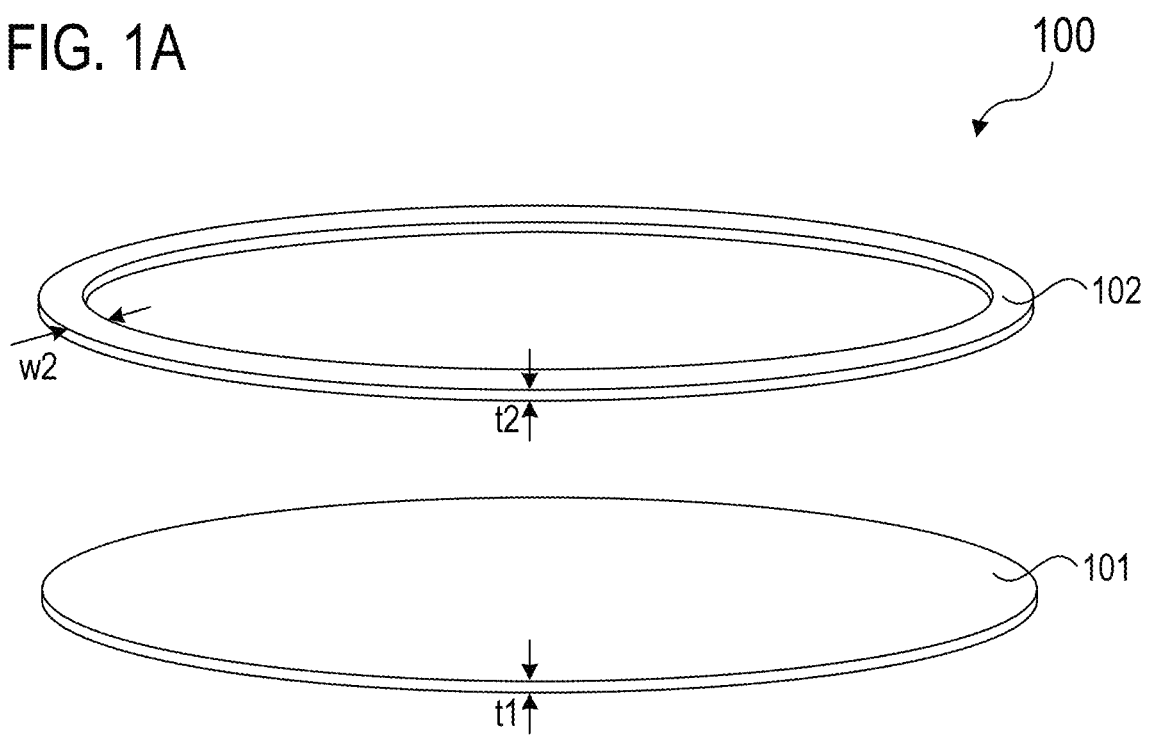
FIG. 1A and FIG. 1B are perspective views illustrating a wafer arrangement and a method for processing a wafer in accordance with various embodiments.

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, . . . , etc.

The term "a plurality" may be understood to include any integer number greater than or equal to two, i.e. two, three, four, five, . . . , etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

Mechanical stability of a wafer may need to be increased for safe handling and/or processing of the wafer. To this end, a wafer may conventionally include a support ring, e.g. so-called "Taiko ring", formed at an edge region of the wafer, thereby increasing mechanical stability of the wafer.

In accordance with conventional support ring concepts, a height of the support ring may be pre-defined by so-called pre-grinding. Depending on the application, the height of the ring may be larger than about 200 μm up to an initial thickness of the starting wafer depending on the wafer diameter. In principle, processability of thin wafers having a higher bow/stress level depending on process flow, e.g. due to a thick front side metallization, may be made possible using a thicker ring. However, conventional support ring concepts may be limited with respect to a maximum possible height of the ring, which may be about the original thickness of the starting wafer, which is depending on the wafer diameter, as an example 725 μm for an 8 inch wafer. Thus, it may become difficult to realize concepts which require wafers with even thicker front side metallization. Furthermore, complexity during frame lamination may increase with increasing height of the support ring. Furthermore, the support ring may also require a minimum width to provide sufficient mechanical stability.

In accordance with various embodiments, a detachable wafer support ring (e.g., back side support ring) may be provided. The detachable wafer support ring may be attached to a wafer and subsequently detached again from the wafer. Thus, the detachable wafer support ring may be re-used, for example for use with another wafer. Illustratively, a wafer support ring in accordance with various embodiments may be provided as a separate element (i.e., separate from the wafer), in contrast to a conventional wafer support ring (e.g., "Taiko ring") which may be formed from the wafer material itself and thus forms an integral part of the wafer.

Thus, in accordance with various embodiments, applicability of the wafer support ring (e.g. back side support ring) concept may be enhanced, and/or flexibility with respect to height of a support ring may be enhanced.

In accordance with various embodiments, the thickness of a support ring may be decoupled from an initial thickness of a wafer (e.g., silicon wafer). Due to this decoupling, thicker support rings may be implemented, by means of which new technology concepts may be implemented, e.g. front side metallizations with metal thicknesses (e.g., Cu thickness) greater than about 20 µm also for ultrathin wafers (e.g., silicon wafers). In one or more embodiments, the term "ultrathin wafer" may include or may refer to a wafer having a thickness of less than or equal to about 280 µm, for example in the range from about 10 µm to about 250 µm, for example in the range from about 20 µm to about 250 µm, depending on wafer diameter.

In accordance with various embodiments, the width of the support ring may be less than the width of conventional support ring concepts. In one or more embodiments, the term "width" may include or may refer to a distance between an outer circumference and an inner circumference of the support ring. In one or more embodiments, the term "width" may include or may refer to a difference between an outer diameter and an inner diameter of the support ring.

Figure 1B:
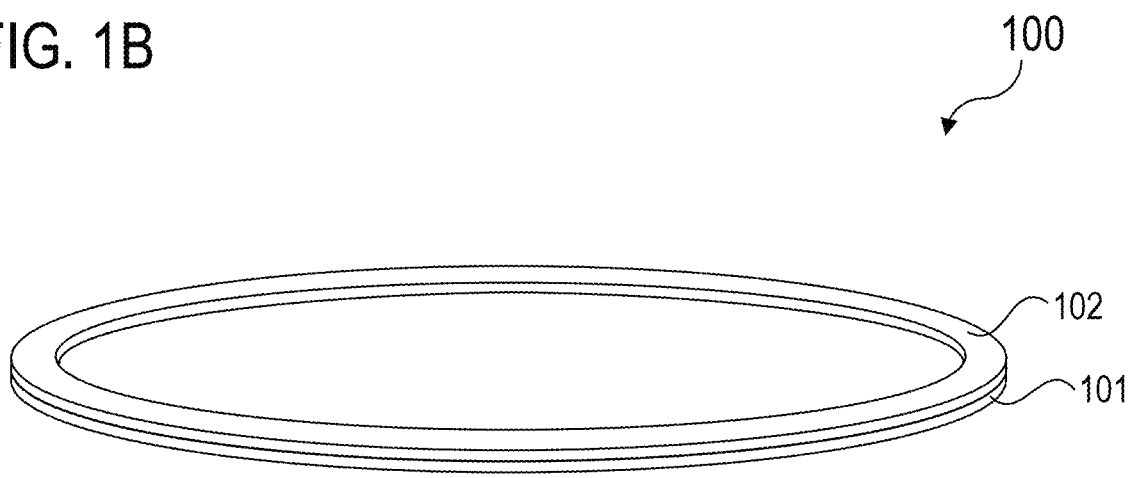

FIG. 1A and FIG. 1B show, as schematic perspective views, wafer arrangement 100 in accordance with various embodiments.

Wafer arrangement 100 may include wafer 101 and wafer support ring 102. Wafer 101 and wafer support ring 102 may be configured to be releasably attachable to one another.

In one or more embodiments, wafer 101 and wafer support ring 102 may be configured to be reversibly mechanically attachable to one another, for example by means of a mechanical locking mechanism, e.g. a twistlock mechanism.

In one or more embodiments, wafer 101 and wafer support ring 102 may be configured to be releasably attachable to one another without using an adhesive.

In one or more embodiments, wafer 101 and wafer support ring 102 may be configured to be releasably attachable to one another by means of magnetic adhesion. That is, a magnetic force between wafer 101 and wafer support ring 102 may serve to attach wafer support ring 102 to wafer 101. To this end, wafer 101 and wafer support ring 102 may, for example, contain a magnetic material in accordance with an embodiment. The magnetic force or adhesion between wafer 101 and wafer support ring 102 may, for example, be strong enough such that wafer supporting ring 102 does not fall off wafer 101 under the effect of gravity, but may also be weak enough such that wafer support ring 102 may be pulled off wafer 101 without causing damage to wafer 101 or wafer support ring 102.

FIG. 1A shows wafer arrangement 100 in a state where wafer support ring 102 is not attached to wafer 101, while FIG. 1B shows wafer arrangement 100 in a state where wafer support ring 102 is attached to wafer 101. Wafer support ring 102 may, for example, be attached to a back side of wafer 101.

Wafer 101 may, for example, have a thickness (denoted as "t1" in FIG. 1A) in the range from about 30 µm to about 280 µm, for example in the range from about 50 µm to about 220 µm, for example about 120 µm, however wafer 101 may have other values of the thickness.

Wafer support ring 102 may be temporarily attached to wafer 101, for example during processing and/or handling of wafer 101. Wafer support ring 102 may be detached from wafer 101 without causing damage to wafer 101 or support ring 102. Wafer support ring 102 may be attached to wafer 101 and detached again from wafer 101 once or several times. Wafer support ring 102 may be attached to a first wafer, e.g. wafer 101, e.g. for providing mechanical stability during processing and/or handling of the first wafer, may subsequently be detached from the first wafer and attached to a second wafer, e.g. for providing mechanical stability during processing and/or handling of the second wafer, may subsequently be detached from the second wafer and attached to a third wafer, . . . , etc. That is, wafer support ring 102 may be sequentially used for a plurality of wafers, e.g. for providing mechanical stability during processing and/or handling of the respective wafer.

Figure 2A:
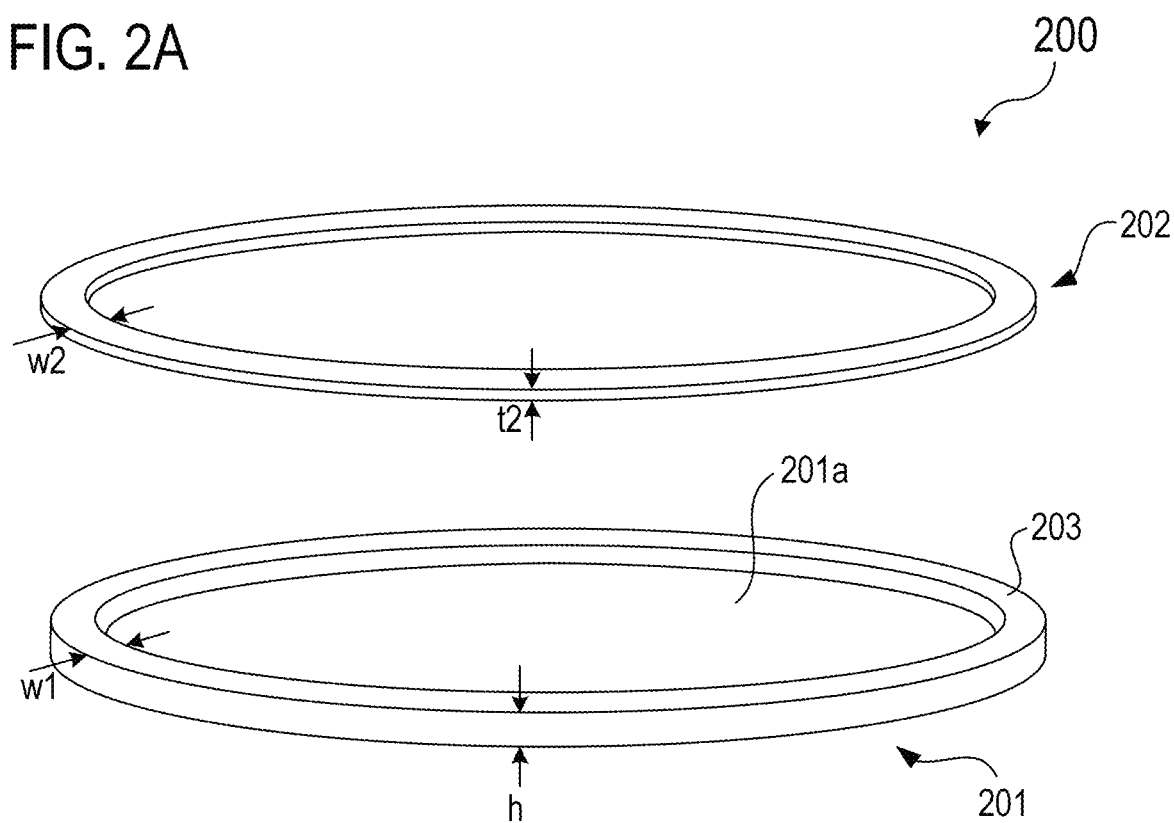
FIG. 2A and FIG. 2B are perspective views illustrating a wafer arrangement and a method for processing a wafer in accordance with various embodiments.
Figure 2B:
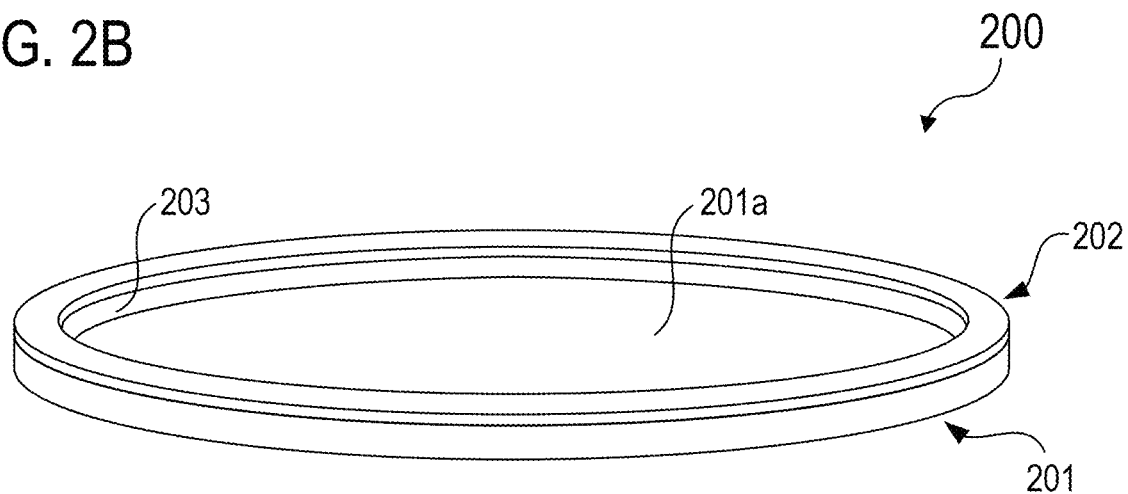

FIG. 2A and FIG. 2B show, as schematic perspective views, wafer arrangement 200 in accordance with various embodiments.

Wafer arrangement 200 may include wafer 201 and wafer support ring 202. Wafer 201 and wafer support ring 202 may be configured to be releasably attachable to one another, for example in a similar or the same manner as wafer 101 and wafer support ring 102 of wafer arrangement 100.

FIG. 2A shows wafer arrangement 200 in a state where wafer support ring 202 is not attached to wafer 201, while FIG. 2B shows wafer arrangement 200 in a state where wafer support ring 202 is attached to wafer 201.

Wafer arrangement 200 differs from wafer arrangement 100 mainly in that wafer 201 includes protruding structure 203 disposed at an edge region of wafer 201, wherein wafer support ring 202 may be (releasably) attached to protruding structure 203. The edge region may include or may be a peripheral region of wafer 201.

In one or more embodiments, protruding structure 203 may be disposed at a back side of wafer 201.

In one or more embodiments, protruding structure 203 may be a ring structure at least partially surrounding an inner portion 201a of wafer 201.

In one or more embodiments, the ring structure may be enclosing inner portion 201a of wafer 201.

In one or more embodiments, the ring structure may be a circular ring structure.

In one or more embodiments, the ring structure may be a so-called Taiko ring.

In one or more embodiments, protruding structure 203 may have a height (denoted as "h" in FIG. 2A) of less than or equal to a starting thickness of the wafer, for example in the range from about 200 µm to about the starting thickness of the wafer, depending on wafer diameter, for example in the range from about 200 µm to about 800 µm, for example about 700 µm, although other values of the height may be possible as well in accordance with other embodiments.

In one or more embodiments, height "h" of protruding structure 203 may be a distance between a bottom surface of wafer 201 and a top surface of protruding structure 203. In one or more embodiments, the top surface of protruding structure 203 may include or may be a surface that faces in the same or substantially the same direction as a top surface of wafer 201. In one or more embodiments, the top surface of protruding structure 203 may include or may be a surface that faces in the same or substantially the same direction as the surface of inner portion 201a of wafer 201.

In one or more embodiments, protruding structure 203 at the edge region of wafer 201 may be configured as a support structure of wafer 201, for example as a support ring, wherein the support structure is an integral part of wafer 201. That is, the support structure, e.g. support ring, cannot be removed without at least partially damaging the wafer or affecting (e.g., decreasing) the diameter of the wafer 201, which may have the effect that the wafer 201 can no longer be processed by a standard processing scheme.

Due to protruding structure 203 disposed at the edge region of wafer 201, a thickness of wafer 201 at the edge region may be larger than a thickness of inner portion 201a of wafer 201. For example, in one or more embodiments, a thickness of inner portion 201a of wafer 201 may be similar or the same as thickness "t1" of wafer 101, while a thickness of wafer 201 at the edge region may be similar or the same as height "h" of protruding structure 203.

In one or more embodiments, protruding structure 203 at the edge region of wafer 201 may be achieved through a so-called Taiko process, e.g., which process leaves a ring of, e.g., a few millimeters in width on the edge region of a wafer and removes material only from the inner area of the backside of wafer 201 through a grinding process. In this case, protruding structure 203 may be configured as a so-called Taiko ring in accordance with one or more embodiments.

In one or more embodiments, protruding structure 203 may have an interrupted structure. In one or more embodiments, protruding structure 203 may have a plurality of segments that may be separated from one another. In one or more embodiments, the segments may be equally shaped and/or equally spaced. In one or more embodiments, protruding structure 203 may have one or more slits cutting through protruding structure 203. In one or more embodiments, the slits may be inclined against a radial axis of wafer 201. In one or more embodiments, the slits may cut radially through protruding structure 203.

In one or more embodiments, the term "radially" as used herein may refer to a direction that is associated with a radial axis or radius of a wafer (e.g., wafer 101 or 201) or wafer support ring (e.g., wafer support ring 102 or 202).

In one or more embodiments, protruding structure 203 at the edge region of wafer 201 may be formed by grinding wafer material from inner portion 201a of wafer 201. Alternatively, material may be removed from inner portion 201a through many different means, e.g. etching (wet and/or dry chemical etching), various chemical-mechanical methods, laser cutting, in general any method for mechanical and/or chemical and/or physical removal of semiconductor material (e.g., silicon). Through these methods, inner portion 201a may be shaped to meet the dimensions required by a given application.

In accordance with various embodiments, wafer 101/201 and wafer support ring 102/202 may be configured such that wafer support ring 102/202 can be attached to wafer 101/201 and subsequently detached from wafer 101/201 without causing damage to wafer 101/201 or wafer support ring 102/202.

In one or more embodiments, wafer support ring 102/202 and wafer 101/201 may have approximately the same diameter. For example, in one or more embodiments, wafer support ring 102/202 may have the same diameter as wafer 101/201. For example, in one or more embodiments, wafer support ring 102/202 may have a diameter that differs by up to 1%, e.g. up to 0.5%, from the diameter of wafer 101/201. For example, in one or more embodiments, wafer support ring 102/202 may have a diameter that is up to 1%, e.g. up to 0.5% larger than the diameter of wafer 101/201.

In one or more embodiments, wafer 101/201 and wafer support ring 102/202 may be configured to be reversibly mechanically attachable to one another by bringing wafer 101/201 and wafer support ring 102/202 into mechanical contact with one another and then rotating at least one of wafer 101/201 and wafer support ring 102/202 relative to one another about an axis that is perpendicular to a main processing surface of wafer 101/201.

In one or more embodiments, wafer 101/201 and wafer support ring 102/202 may be configured to be releasably attachable to one another by means of a twistlock mechanism.

FIGS. 1A and 1B and FIGS. 2A and 2B, respectively, are simplified schematic views to explain a general working principle of various embodiments. In accordance with some embodiments, wafer 101 or 201 and/or wafer support ring 102 or 202 may include one or more features, elements or structures that may be used to enable attachment of wafer support ring 102 or 202 to wafer 101 or 201 but are not illustrated in the figures.

Figure 4A:
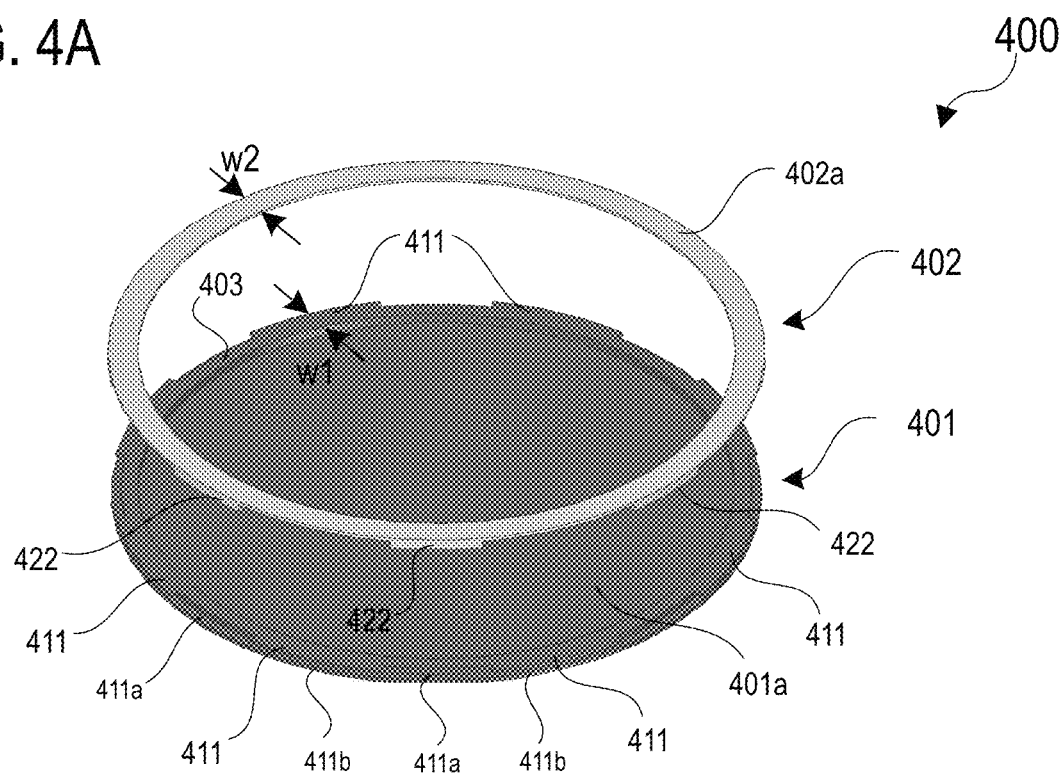
FIGS. 4A to 4C and FIGS. 5A to 5C are perspective views and side elevation views, respectively, illustrating a wafer arrangement and a method for processing a wafer in accordance with various embodiments.

For example, in accordance with some embodiments, wafer 101 and/or wafer 201 may include a plurality of engagement protrusions formed circumferentially around wafer 101/201 and angularly spaced from one another (not shown, see e.g. FIG. 4A).

In one or more embodiments, the engagement protrusions may be regularly angularly spaced from one another. For example, an angular distance may be the same for each pair of neighboring engagement protrusions.

In one or more embodiments, protruding structure 203 of wafer 201 may include the engagement protrusions.

Furthermore, in accordance with some embodiments, wafer support ring 102 and/or wafer support ring 202 may include a plurality of claw protrusions formed circumferentially around wafer support ring 102/202 and angularly spaced from one another (not shown, see e.g. FIG. 4A).

In one or more embodiments, the claw protrusions may be regularly angularly spaced from one another. For example, an angular distance may be the same for each pair of neighboring claw protrusions.

In one or more embodiments, the angular distance between neighboring claw protrusions may be the same or substantially the same as the angular distance between neighboring engagement protrusions.

In one or more embodiments, the claw protrusions may be configured to engage into the engagement protrusions.

In one or more embodiments, the claw protrusions may be arranged and/or configured to be axially insertable between the engagement protrusions.

In one or more embodiments, the claw protrusions may engage into the engagement protrusions in a manner so that the claw protrusions and the engagement protrusions radially overlap.

In one or more embodiments, the claw protrusions may protrude radially inwardly and the engagement protrusions may protrude radially outwardly, or vice versa. In other words, at least a portion of the claw protrusions may point in a direction towards the center of the wafer support ring or wafer while the engagement protrusions may point in a direction away from the center of the wafer support ring or wafer, or vice versa.

In one or more embodiments, wafer 101 and/or 201 may include or may be made from a semiconductor material such as, for example, silicon, however wafer 101 and/or 201 may include or may be made from other semiconductor materials, including compound semiconductor materials such as, for example, germanium, silicon germanium, silicon carbide, indium arsenide, or the like.

In one or more embodiments, wafer support ring 102/202 may include a first material and wafer 101/201 may include a second material, wherein the first material and the second material may have the same or substantially the same coefficient of thermal expansion (CTE). For example, in one or more embodiments, a relative difference between the CTE of the first material and the CTE of the second material may be less than 50%, e.g. less than 20%, e.g. less than 10%, e.g. less than 5%, e.g. less than 1%. This may, for example, be useful when the wafer support ring 102/202 and the wafer 101/201 are subjected to a thermal treatment while the wafer support ring 102/202 is attached to the wafer 101/201.

In one or more embodiments, wafer support ring 102 and/or 202 may include or may be made from at least one material selected from a group of materials, the group consisting of: alkaline free glass, borosilicate glass, molybdenum, silicon, or a combination of two or more of the aforementioned materials.

In one or more embodiments, wafer support ring 102/202 may include or may be made from the same material as wafer 101/201, for example silicon.

In one or more embodiments, wafer support ring 102 and/or 202 may have a thickness (denoted as "t2" in FIG. 1A and FIG. 2A) in the range from about 100 μm to about 2000 μm, for example in the range from about 300 μm to about 2000 μm, for example about 700 μm.

Figure 5A:
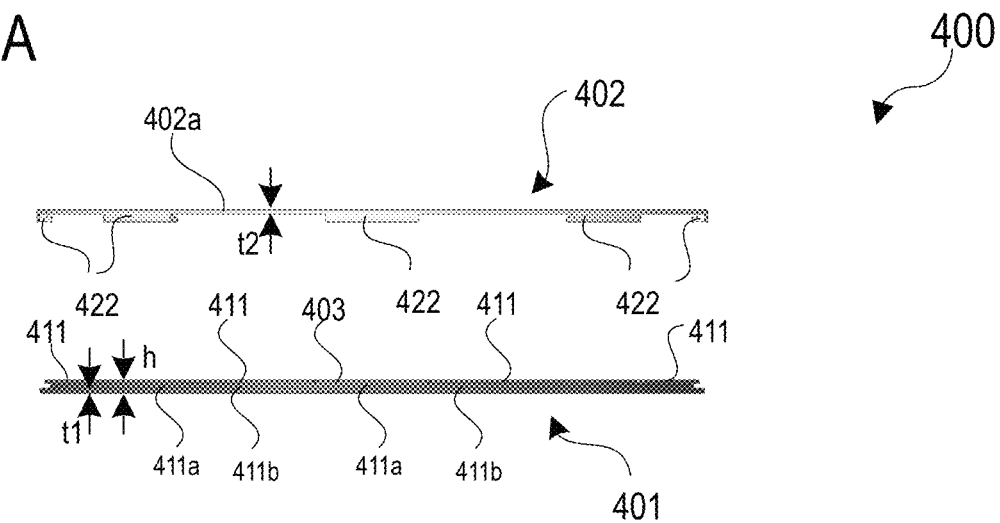

In one or more embodiments, thickness "t2" may correspond to a thickness of a main body of the wafer support ring, for example excluding a thickness of optional claw protrusions of the wafer support ring (see, e.g., FIG. 5A).

In one or more embodiments, wafer support ring 102 and/or 202 may have a width (denoted as "w2" in FIG. 1A and FIG. 2A) of less than or equal to about 5.0 mm, for example in the range from about 2.5 mm to about 5.0 mm, for example in the range from about 3.0 mm to about 4.0 mm, for example about 3.5 mm.

In one or more embodiments, the width of wafer support ring 102 and/or 202 may correspond to a distance between an inner circumference and an outer circumference of wafer support ring 102/202.

In one or more embodiments, the width of wafer support ring 202 may be the same or at least substantially the same as a width of protruding structure 203 (denoted as "w1" in FIG. 2A).

FIG. 3 shows a method 300 for processing a wafer in accordance with various embodiments.

Method 300 may include: providing a wafer and a wafer support ring (in 302); and subsequently attaching the wafer support ring to the wafer (in 304).

In one or more embodiments, method 300 may further include applying at least one of a wafer processing step or wafer handling step to the wafer while the wafer support ring is attached to the wafer (as shown in 306).

In one or more embodiments, method 300 may further include detaching the wafer support ring from the wafer after attaching the wafer support ring has been attached to the wafer, for example after the at least one processing step has been carried out (as shown in 308).

In one or more embodiments, attaching the wafer support ring to the wafer may include attaching the wafer support ring to a back side of the wafer.

In one or more embodiments, attaching the wafer support ring to the wafer may include bringing the wafer and the wafer support ring into mechanical contact with one another and then moving at least one of the wafer and the wafer support ring relative to one another.

In one or more embodiments, moving at least one of the wafer and the wafer support ring relative to one another may include rotating at least one of the wafer and the wafer support ring relative to one another about an axis that is perpendicular to a main processing surface of the wafer.

In one or more embodiments, the wafer support ring may include a plurality of claw protrusions and the wafer may include a plurality of engagement protrusions into which the claw protrusions can engage, wherein attaching the wafer support ring to the wafer may include attaching the wafer support ring by a twistlock mechanism.

In one or more embodiments, the wafer support ring may include a plurality of claw protrusions and the wafer may include a plurality of engagement protrusions into which the claw protrusions can engage, wherein by means of rotating at least one of the wafer and the wafer support ring relative to one another the claw protrusions overlap the engagement protrusions.

In one or more embodiments, the wafer support ring may include a plurality of claw protrusions formed circumferentially around the wafer support ring and angularly spaced from one another, and the wafer may include a plurality of engagement protrusions into which the claw protrusions can engage, wherein the engagement protrusions are formed circumferentially around the wafer and are angularly spaced from one another so that the claw protrusions can be axially inserted between the engagement protrusions, wherein attaching the wafer support ring to the wafer may include axially inserting the claw protrusions of the wafer support ring between the engagement protrusions of the wafer and subsequently rotating at least one of the wafer and the wafer support ring relative to one another so that the claw protrusions and the engagement protrusions radially overlap.

In one or more embodiments, detaching the wafer support ring from the wafer may include rotating at least one of the wafer and the wafer support ring relative to one another so that the claw protrusions and the engagement protrusions no longer radially overlap.

In one or more embodiments, rotating the at least one of the wafer and the wafer support ring to attach the wafer support ring to the wafer may include rotating the at least one of the wafer and the wafer support ring in a first direction, and rotating the at least one of the wafer and the wafer support ring to detach the wafer support ring from the wafer may include rotating the at least one of the wafer and the wafer support ring in a second direction which is opposite to the first direction. In other words, a rotational direction used for attachment may be opposite to a rotational direction used for detachment in accordance with some embodiments. For example, a clockwise rotation of the wafer support ring relative to the wafer may be performed for attachment while a counterclockwise rotation of the wafer support ring relative to the wafer may be performed for detachment, or vice versa, in accordance with one or more embodiments. In accordance with other embodiments, the rotational direction used for attachment may be the same as the rotational direction used for detachment.

In one or more embodiments, the wafer may include a protruding structure, for example a ring structure, e.g. a Taiko ring, disposed at an edge region of the wafer, wherein the protruding structure may include the plurality of engagement protrusions.

In one or more embodiments, method 300 may further include attaching the wafer support ring to at least one additional wafer after the wafer support ring has been detached from the wafer.

FIGS. 4A to 4C and FIGS. 5A to 5C are perspective views and side elevation views, respectively, illustrating a wafer arrangement 400 and a method for processing a wafer in accordance with various embodiments.

FIGS. 4A and 5A show, as a perspective view and as a side elevation view, respectively, that a wafer 401 (e.g., a silicon wafer) and a wafer support ring 402 may be provided. Wafer 401 and wafer support ring 402 are configured to be releasably attachable to one another.

Wafer 401 has a protruding structure 403, which may be in the form of a ring at least partially surrounding an inner portion 401a of wafer 401. In one or more embodiments, protruding structure 403 may have been obtained by removing wafer material from inner portion 401a at a side (e.g., back side) of wafer 401 to form a thinned wafer structure and a protruding structure at an edge region of wafer 401 to at least partially surround inner portion 401a of wafer 401. In one or more embodiments, protruding structure 403 may protrude from a surface of inner portion 401a of wafer 401 obtained after removing the wafer material from inner portion 401a. In one or more embodiments, the surface may include or may be a surface that faces in the same or substantially the same direction as the side (e.g., back side) of wafer 401.

In one or more embodiments, protruding structure 403 at the edge region of wafer 401 may be a ring structure, which completely encloses inner portion 401a of wafer 401. In one or more embodiments, protruding structure 403 at the edge region of wafer 401 may be a circular ring structure, which at least partially surrounds but may completely enclose inner portion 401a of wafer 401.

In one or more embodiments, protruding structure 403 at the edge region of wafer 401 may be an annular or substantially annular structure, which at least partially surrounds but may completely enclose inner portion of wafer 401.

Compared to a conventional wafer having a Taiko ring as support structure, wafer 401 has a modified geometric shape, wherein wafer material (e.g., silicon) of protruding structure 403 has a plurality of recesses 411a and a plurality of grooves 411b so that a plurality of engagement protrusions 411 are formed. Eight engagement protrusions 411 are shown in FIG. 4A as an example, however the number of engagement protrusions 411 may be different from eight, and may be greater than or equal to two in accordance with some embodiments, for example an even number greater than or equal to two, or an odd number greater than or equal to three.

It should be noted that, in accordance with some embodiments, wafer 401 may not have protruding structure 403. That is, the edge region of wafer 401 may have the same thickness as inner portion 401a of wafer 401 (similar to wafer 101 of FIGS. 1A and 1B), and engagement protrusions 411, or recesses 411a and grooves 411b, may be formed in the edge region of wafer 401.

As shown, engagement protrusions 411 may be formed circumferentially around wafer 401 and may be angularly spaced from one another.

Illustratively, a recess 411a may in each case be disposed between two neighboring engagement protrusions 411, and a groove 411b may in each case be disposed between an engagement protrusion 411 and a side (e.g., main processing side, e.g. front side) of wafer 401.

In one or more embodiments, engagement protrusions 411 may be regularly angularly spaced from one another. For example, an angular distance may be the same for each pair of neighboring engagement protrusions 411.

In one or more embodiments, engagement protrusions 411 may all have the same or substantially the same size, e.g. length, width, and/or height.

In one or more embodiments, recesses 411a and grooves 411b may be formed after protruding structure 403 has been formed.

In one or more embodiments, recesses 411a and grooves 411b may be formed before protruding structure 403 is formed.

In one or more embodiments, recesses 411a and grooves 411b may be formed by removing wafer material from wafer 401, for example from protruding structure 403, for example by means of mechanical treatment, e.g. milling, grinding, laser treatment, eroding, plasma treatment or a combination of two or more of the aforementioned processes.

Figure 9A:
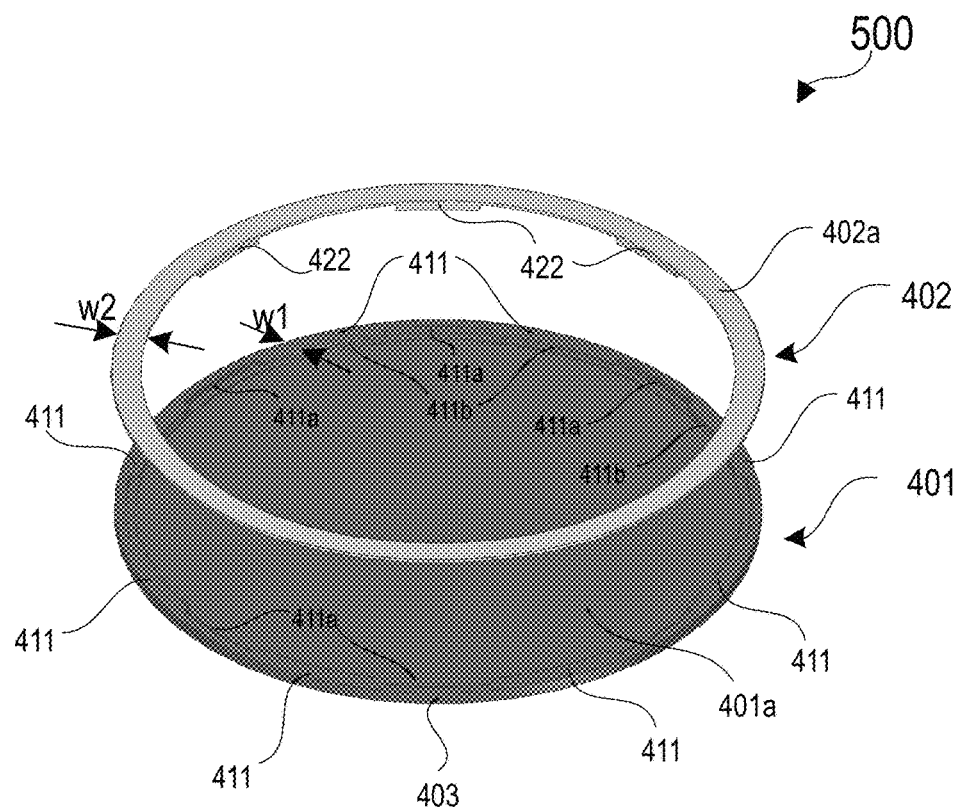
FIGS. 9A to 9C and FIGS. 10A to 10C are perspective views and side elevation views, respectively, illustrating a wafer arrangement and a method for processing a wafer in accordance with various embodiments.
Figure 10A:
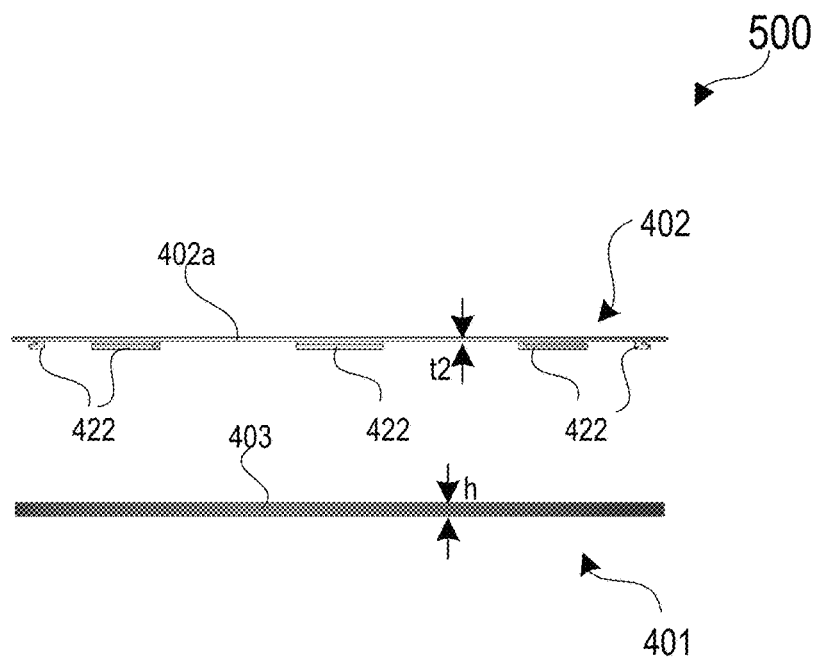
Figure 9B:
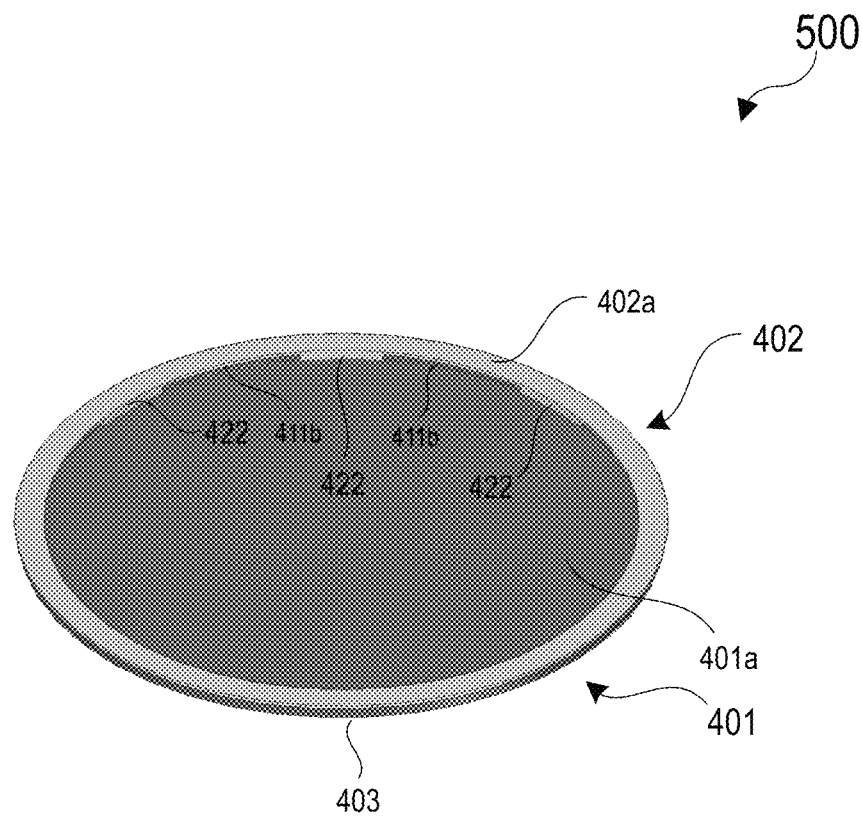
Figure 10B:
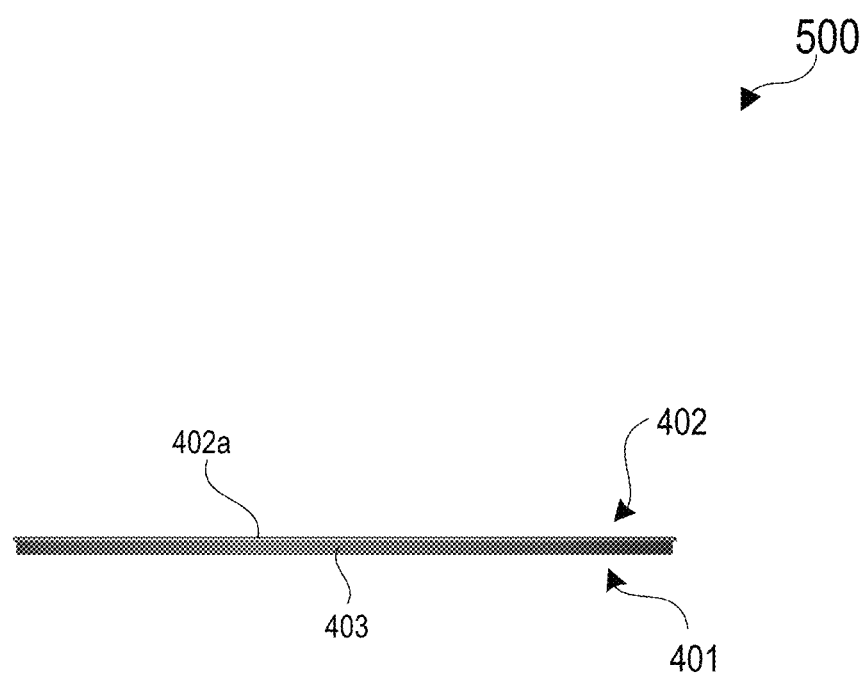
Figure 9C:
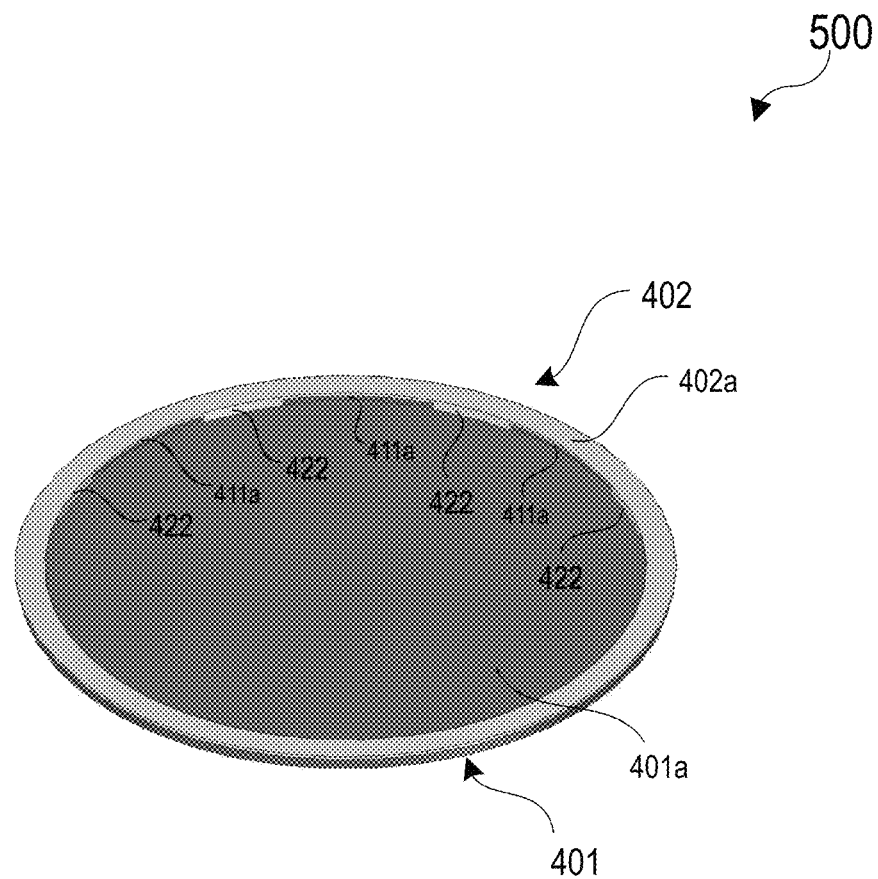
Figure 10C:
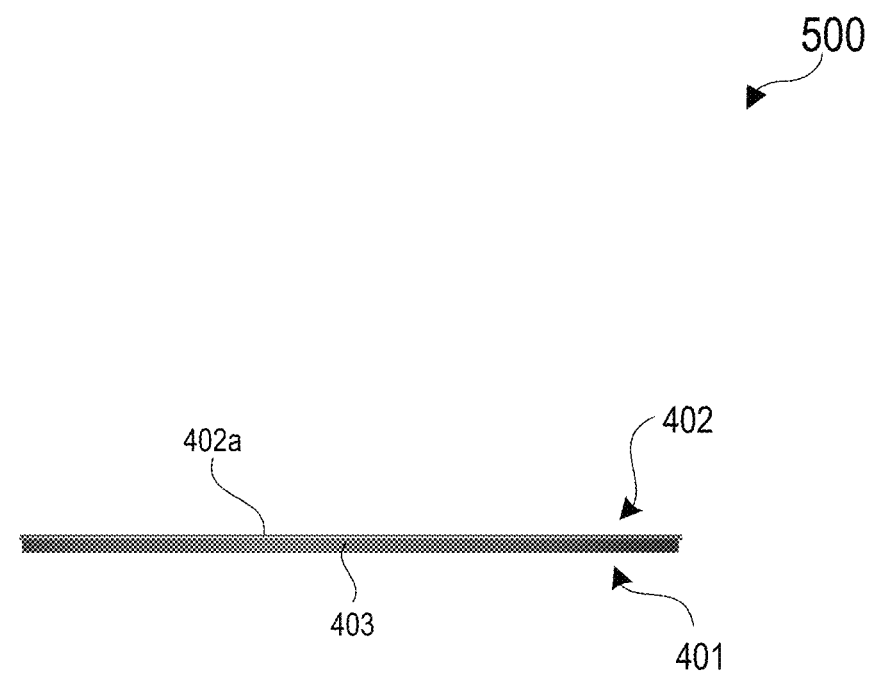

In one or more embodiments, recesses 411a and grooves 411b may be formed at an outer side of protruding structure 403, as shown. The outer side of protruding structure 403 may be a side facing away from the center of wafer 401. Thus, engagement protrusions 411 may protrude radially outwardly in this case, as shown. In accordance with other embodiments, recesses 411a and/or grooves 411b may be formed at an inner side of protruding structure 403 (not shown, see e.g. FIG. 9A). The inner side of protruding structure 403 may be a side facing towards the center of wafer 401. Thus, engagement protrusions 411 may protrude radially inwardly in this case (not shown, see, e.g., FIG. 9A).

FIGS. 4A and 5A further show wafer support ring 402, which may illustratively form a counterpart to wafer 401, and which may engage or lock into wafer 401.

Wafer support ring 402 may have a plurality of claw protrusions 422, as shown. In one or more embodiments, claw protrusions 422 may extend from a main body 402a of wafer support ring 402, as shown. In accordance with some embodiments, the number of claw protrusions 422 may be equal to the number of engagement protrusions 411 of wafer 401. For example, in the example shown in FIG. 4A, the number of claw protrusions 422 may be eight, wherein each claw protrusion 422 may engage into a respective engagement protrusion 411 of wafer 401. However, in accordance with other embodiments the number of claw protrusions 422 may be different from the number of engagement protrusions 411. In accordance with various embodiments, the number of engagement protrusions 411 may be equal to or greater than the number of claw protrusions 422.

As shown, claw protrusions 422 may be formed circumferentially around wafer support ring 402 and may be angularly spaced from one another.

In one or more embodiments, claw protrusions 422 may be regularly angularly spaced from one another. For example, an angular distance may be the same for each pair of neighboring claw protrusions 422. Claw protrusions 422 may be configured such that they may be axially inserted between engagement protrusions 411 of wafer 401. For example, claw protrusions 422 may be configured to fit into recesses 411a of wafer 401.

As shown, claw protrusions 422 may protrude radially inwardly. In other words, claw protrusions 422 may point in a direction towards the center of wafer support ring 402 or wafer 401. Thus, claw protrusions 422 may engage into engagement protrusions 411 protruding radially outwardly. For example, each claw protrusion 422 may engage into a respective engagement protrusion 411 of the plurality of engagement protrusions 411 of wafer 401. In accordance with other embodiments, claw protrusions 422 may protrude radially outwardly and may engage into engagement protrusions 411 protruding radially inwardly (not shown).

Figure 4B:
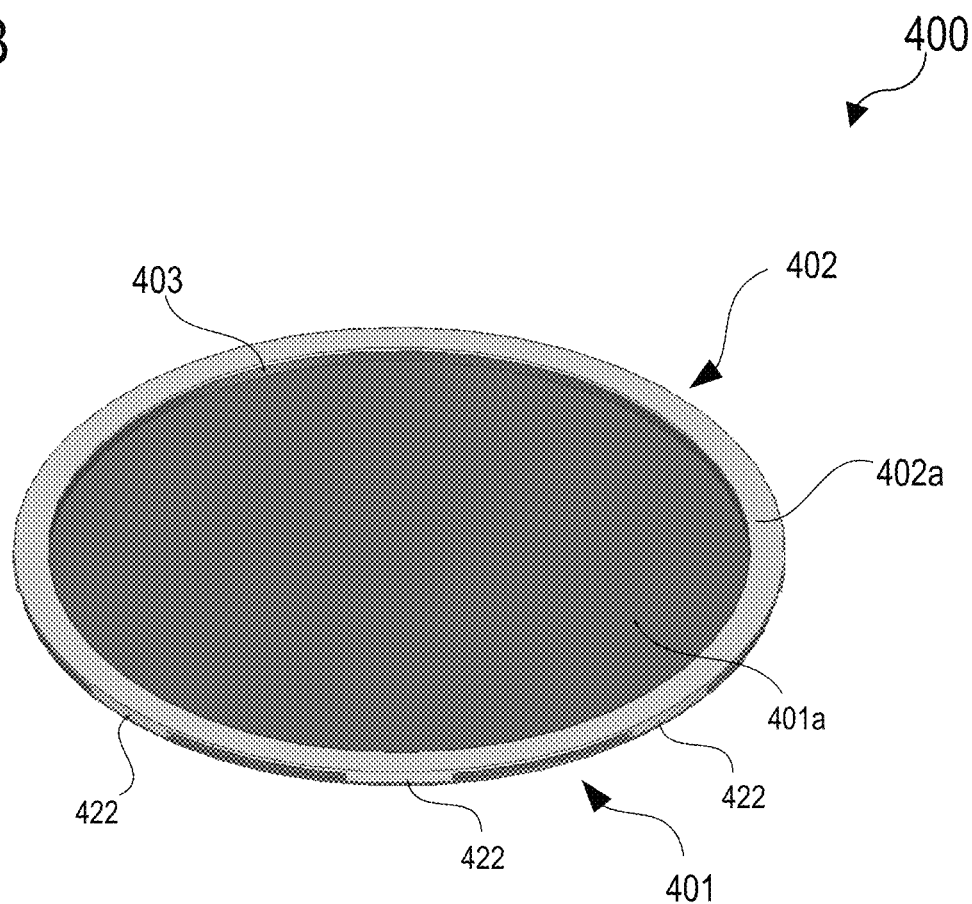
Figure 5B:
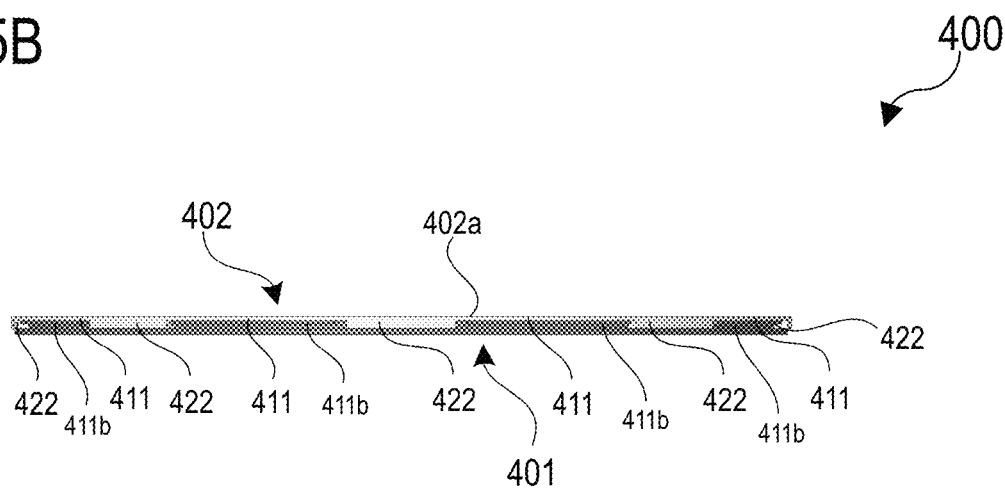

FIGS. 4B and 5B show, as a perspective view and as a side elevation view, respectively, that the two shapes, i.e. wafer 401 and wafer support ring 402, may be brought together. For example, wafer support ring 402 may be placed onto wafer 401 (e.g., onto protruding structure 403), or vice versa, in accordance with some embodiments. That is, wafer support ring 402 and wafer 401 may be in mechanical contact, e.g. direct mechanical contact, with each other. Wafer support 401 and wafer support ring 402 may be arranged such that claw protrusions 422 are inserted between engagement protrusions 411. For example, each claw protrusion 422 may be inserted between two neighboring engagement protrusions 411, as shown in FIG. 5B. In the state shown in FIGS. 4B and 5B, claw protrusions 422 of wafer support ring 402 do not engage into engagement protrusions 411 so that wafer support ring 402 is not attached to wafer 401 but might, for example, fall off from wafer 401 under effect of gravity when the wafer arrangement is turned upside down (i.e., wafer up and wafer support ring down).

Figure 4C:
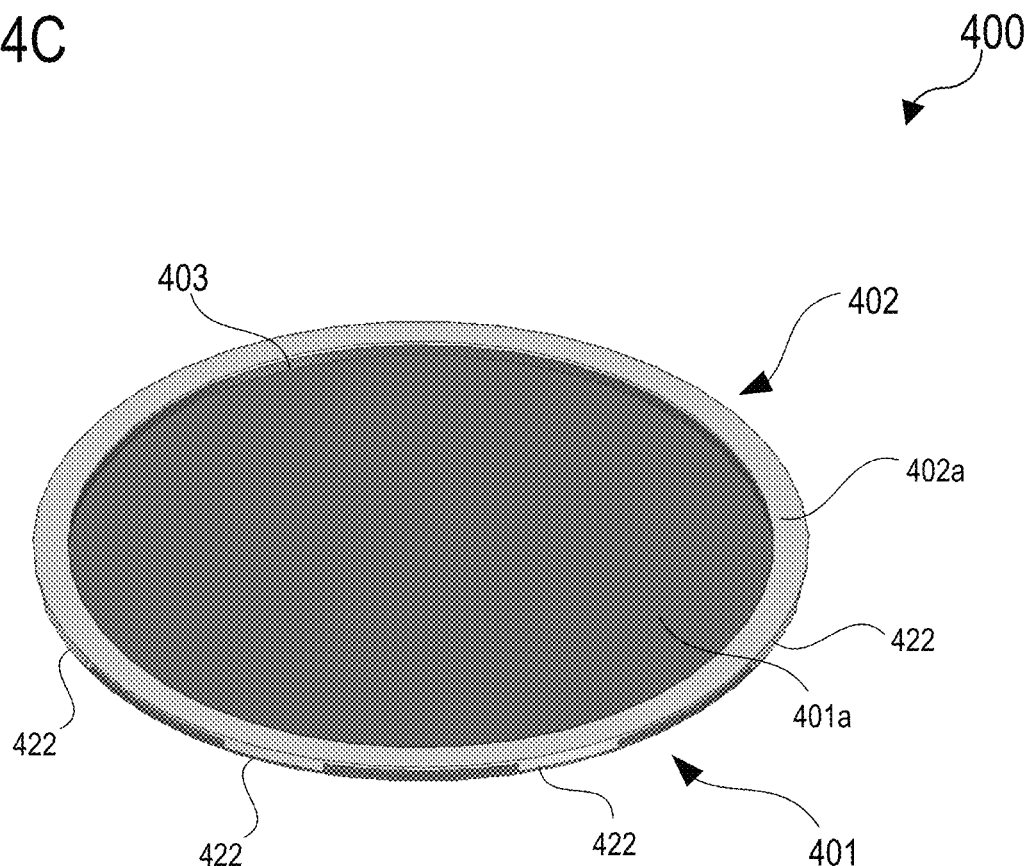
Figure 5C:
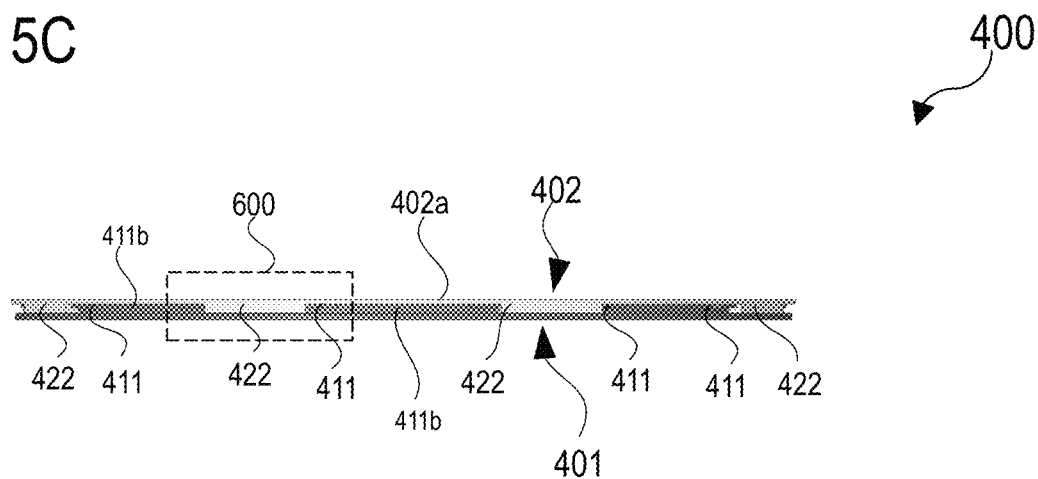

FIGS. 4C and 5C show, as a perspective view and as a side elevation view, respectively, that the two shapes, i.e. wafer 401 and wafer support ring 402, may be fixated by a rotation of wafer 401 and/or wafer support ring 402 relative to one another about the wafer axis 401, i.e. about an axis that is perpendicular to a main processing surface of wafer 401 and goes through the center of wafer 401. By means of the rotation, claw protrusions 422 of wafer support ring 402 may be brought into a position where they may engage into engagement protrusions 411 of wafer 401, as shown in FIG. 5C and also in FIG. 6, which is an enlarged view of section 600 in FIG. 5C. In the embodiment shown in FIGS. 4C and 5C, claw protrusions 422 may radially overlap engagement protrusions 411.

In one or more embodiments, engagement protrusions 411 and/or claw protrusions 422 may be configured such that both a clockwise rotation and a counterclockwise rotation may be used to achieve a fixation of wafer 401 and wafer support ring 402, as shown. In other embodiments, engagement protrusions 411 and/or claw protrusions 422 may be configured such that only a clockwise rotation or only a counterclockwise rotation will be suitable to achieve fixation of wafer 401 and wafer support ring 402. For example, in accordance with some embodiments, engagement protrusions 411 may include a receiving portion 411c, e.g. including a recess, e.g. an inverse wedge-shaped recess or the like, and claw protrusions 422 may include a protruding portion 422a, e.g. a wedge-shaped protrusion or the like, that matches receiving portion 411c, as shown in FIG. 7, which is an enlarged view showing a section 600' of a wafer arrangement in accordance with some embodiments, similar to section 600 of FIG. 6. As soon as protruding portions 422a are received in receiving portions 411c, receiving portions 411c may block further rotational movement of wafer support ring 402 in the same direction. For example, a further rotation of wafer support ring 402 in direction 650 shown in FIG. 7 may be blocked by receiving portions 411c, while rotation of wafer support ring 402 in the inverse direction may be possible. Thus, the possibility of inadvertent rotational movement and possibly loosening or detachment of wafer support ring 402 from wafer 401 may be reduced.

Figure 6:
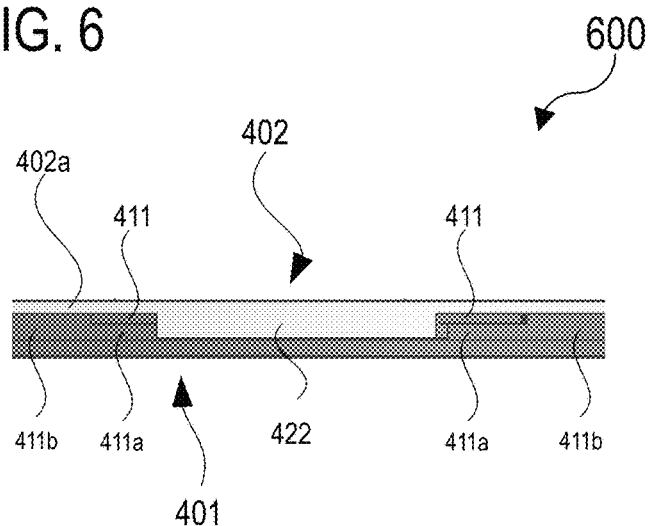
FIG. 6 is an enlarged view of a section of FIG. 5C.
Figure 7:
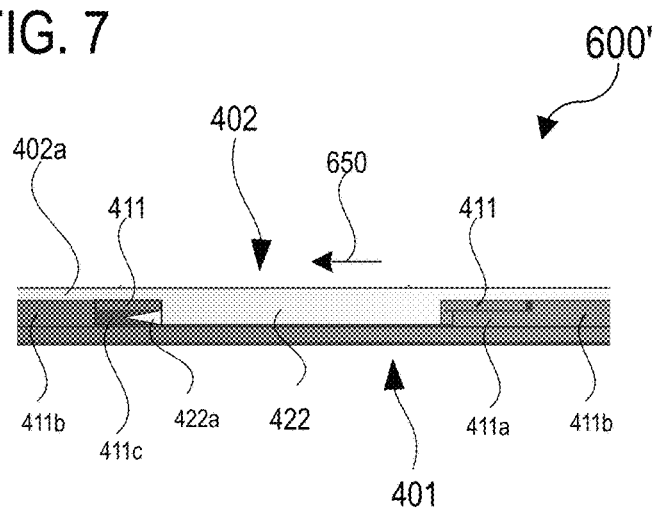
FIG. 7 is an enlarged view of a section of a wafer arrangement in accordance with various embodiments.
Figure 8:
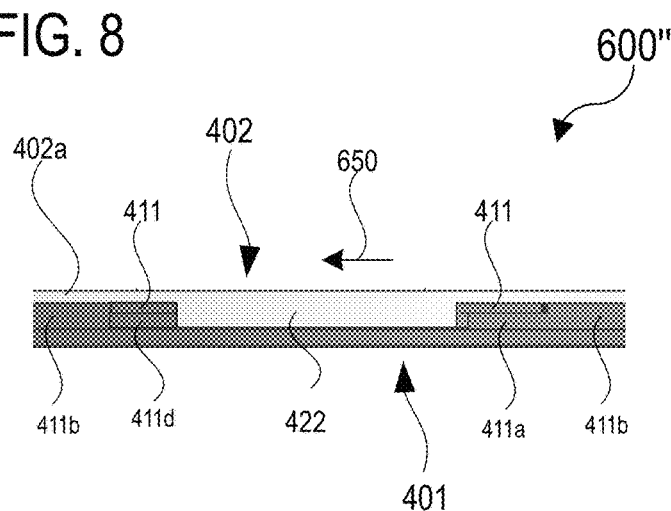
FIG. 8 is an enlarged view of a section of a wafer arrangement in accordance with various embodiments.

FIG. 8 is an enlarged view showing a section 600" of a wafer arrangement in accordance with some embodiments, similar to section 600 of FIG. 6 or section 600' of FIG. 7. In this arrangement, engagement protrusions 411 of wafer 401 may include a blocking portion, in other words stopper portion, 411d. Blocking portions 411d may have a similar effect as receiving portions 411c. That is, they may block further rotation of wafer support ring 402 in direction 650 as soon as claw protrusions 422 have reached blocking portions 411d. In contrast to receiving portions 411c, blocking portions 411d may not need to be configured to receive protruding portions 422a of claw protrusions 422.

Illustratively, FIGS. 4C and 5C (similarly, FIGS. 6 to 8) show a state, in which wafer support ring 402 may be securely attached to wafer 401 by means of claw protrusions 422 being engaged into engagement protrusions 411. For example, claw protrusions 422 being engaged into engagement protrusions 411 may prevent wafer support ring 422 from falling off wafer 401 when the wafer arrangement is turned upside down (i.e., wafer up and wafer support ring down).

Wafer support ring 402 attached to wafer 401 may serve to increase stability of wafer 401, for example during subsequent processing and/or handling steps.

In one or more embodiments, wafer support ring 402 may be detached from wafer 401 again, for example after one or more processing and/or handling steps applied to wafer 401 have been completed. Detaching wafer support ring 402 from wafer 401 may include rotating at least one of wafer 401 and wafer support ring 402 relative to one another (for example, in the same direction as during fixation in accordance with some embodiments, or in the inverse direction in accordance with some embodiments) until claw protrusions 422 no longer engage into engagement protrusions 411, and subsequently taking off wafer support ring 402 from wafer 401.

In accordance with various embodiments, after wafer support ring 402 has been detached from wafer 401, wafer support ring 402 may be re-used. For example, wafer support ring 402 may be attached to another wafer.

FIGS. 9A to 9C and FIGS. 10A to 10C are perspective views and side elevation views, respectively, illustrating a wafer arrangement 500 and a method for processing a wafer in accordance with various embodiments. In FIGS. 9A to 9C and FIGS. 10A to 10C, reference signs that are the same as in FIGS. 4A to 4C and FIGS. 5A to 5C generally denote the same or similar elements and will not be described again in detail here. Reference is made to the description above.

The wafer arrangement 500 and processing method illustrated by FIGS. 9A to 9C and FIGS. 10 to 10C are to some degree similar to the wafer arrangement 400 and processing method illustrated in FIGS. 4A to 4C and FIGS. 5A to 5C, the main difference being that in the wafer arrangement 500 of FIGS. 9A to 10C engagement protrusions 411 protrude radially inwardly. Accordingly, claw protrusions 422 of wafer support ring 402 may protrude radially outwardly and may be configured to engage into engagement protrusions 411. In particular, recesses 411a and grooves 411b may be formed at an inner side of protruding structure 403 (the inner side of protruding structure 403 being a side facing towards the center of wafer 401) to form engagement protrusions 411, and claw protrusions 422 may be formed at an inner circumference of main body 402a of wafer support ring 402.

Wafer 401 and wafer support ring 402 of wafer arrangement 500 may be attached to one another and may be detached from one another by means of a twistlock mechanism, in a similar way as described herein above in connection with wafer arrangement 400 of FIGS. 4A to 5C. In particular, a state shown in FIGS. 9A and 10A corresponds to the state shown in FIGS. 4A and 5A (i.e., wafer 401 and wafer support ring 402 detached from one another), a state shown in FIGS. 9B and 10B corresponds to the state shown in FIGS. 4B and 5B (i.e., wafer 401 and wafer support ring 402 brought into mechanical contact with one another but not yet locked), and a state shown in FIGS. 9C and 10C corresponds to the state shown in FIGS. 4C and 5C (i.e., wafer 401 and wafer support ring 402 fixedly attached to one another by means of rotation).

As will be readily understood, the provision of engagement protrusions and claw protrusions, e.g. engagement protrusions 411 and claw protrusions 422, is just one example of how to configure a wafer and a wafer support ring to be releasably attachable to one another. Other examples include, for example, configuring the wafer support ring and wafer such that they adhere to one another through magnetic force (e.g., by manufacturing the wafer support ring and a portion of the wafer, e.g. the edge region or the protruding structure, such that they contain a magnetic material), electrostatic force, soldering, a temperature release adhesive (in other words, an adhesive that may firmly attach the wafer support ring to the wafer while the temperature is below a certain threshold, and may be released again by increasing the temperature above the threshold), or, in cases using a transparent wafer support ring (e.g., glass ring), a UV sensitive adhesive (in other words, an adhesive that may firmly attach the wafer support ring to the wafer, and may be released again by irradiating the adhesive with ultraviolet (UV) light).

Generally, various embodiments may provide a wafer and a wafer support ring that can be attached to one another and detached again from one another without affecting the wafer or wafer support ring, for example without permanently modifying the structure, e.g., surface, of the wafer, e.g. without leaving residues on the surface, or without decreasing the diameter of the wafer. Illustratively, the integrity of the wafer may be unchanged or essentially unchanged after the wafer support ring has been attached and detached again.

It should also be understood, that the term "ring" or "ring structure" as used herein may include both a circular (or essentially circular) ring or ring structure (e.g., an annulus) and a non-circular (e.g., polygonal or irregularly shaped) ring or ring structure.

In the following, integration of the new processing concept described herein into existing manufacturing schemes will be illustrated in the context of an insulated gate bipolar transistor (IGBT) as an example. As will be readily understood, the new processing concept may be readily applied to other manufacturing schemes as well, such as, for example MOSFET (Metal Oxide Semiconductor Field Effect Transistor) manufacturing processes, compensation device manufacturing processes, diode device manufacturing processes, or any other devices. Generally, the new processing concept may be applied in any existing or future manufacturing scheme that may use a wafer support ring. In accordance with various embodiments, a processing scheme for manufacturing a semiconductor device (e.g., an IGBT) may include one or more of the following: providing a wafer (e.g., silicon wafer) that may be attached to a carrier (e.g., a carrier wafer, e.g. a glass carrier); defining a step of a ring structure in the wafer; subsequently forming one or more recesses in the ring structure (e.g., by means of mechanical treatment) and forming a groove in the ring structure e.g. by means of milling; subsequently thinning the backside of the wafer (including, e.g., "Taiko" grinding and substrate etching); subsequently carrying out one or more backside processing steps of a standard process e.g. including at least one of cleaning, deposition (e.g., electrochemical deposition, e.g., physical deposition), etching (dry and/or wet chemical etching), backside lithography, implantation, anneal (e.g., low temperature anneal (LTA)), or the like; subsequently attaching a wafer support ring to the wafer before demounting the wafer from the carrier; subsequently demounting the wafer from the carrier; subsequently carrying out at least one of front side anneal and back side metallization (including e.g. $H_2$ cleaning); subsequently testing the wafer; detaching the wafer support ring from the wafer by rotational movement before laminating the wafer onto a sawing frame; subsequently laminating the wafer and carrying out further processing in pre-assembly.

A wafer arrangement in accordance with various embodiments may include: a wafer; and a wafer support ring, wherein the wafer and the wafer support ring are configured to be releasably attachable to one another.

In one or more embodiments, the wafer and the wafer support ring may be configured such that the wafer support ring can be detached from the wafer without causing damage to the wafer or the wafer support ring.

In one or more embodiments, the wafer and the wafer support ring may be configured such that the wafer support ring can be attached to the wafer and subsequently detached from the wafer without causing damage to the wafer or the wafer support ring.

In one or more embodiments, the wafer support ring and the wafer may have approximately the same diameter.

In one or more embodiments, the wafer and the wafer support ring may be configured to be reversibly mechanically attachable to one another.

In one or more embodiments, the wafer and the wafer support ring may be configured to be reversibly mechanically attachable to one another by bringing the wafer and the wafer support ring into mechanical contact with one another and then rotating at least one of the wafer and the wafer support ring relative to one another about an axis that is perpendicular to a main processing surface of the wafer.

In one or more embodiments, the wafer and the wafer support ring may be configured to be releasably attachable to one another by means of a twistlock mechanism.

In one or more embodiments, the wafer support ring may include or may be made from a first material and the wafer may include or may be made from a second material, wherein the first material and the second material may have at least substantially the same coefficient of thermal expansion.

In one or more embodiments, the wafer support ring may include or may be made from at least one material selected from a group of materials, the group consisting of: alkaline free glass, borosilicate glass, molybdenum, silicon, or a combination of two or more of the aforementioned materials.

In one or more embodiments, the wafer and the wafer support ring may include or may be made from the same material, for example silicon.

In one or more embodiments, the wafer support ring may have a thickness in the range from about 100 μm to about 2000 μm.

In one or more embodiments, the wafer support ring may have a width of less than or equal to about 5 mm.

In one or more embodiments, the wafer support ring may have a width in the range from about 2.5 mm to about 5 mm.

In one or more embodiments, a back side of the wafer may be configured to be releasably attachable to the wafer support ring.

In one or more embodiments, the wafer may include a protruding structure at an edge region of the wafer.

In one or more embodiments, the edge region may include or may be a peripheral region of the wafer.

In one or more embodiments, the protruding structure may be a ring structure at least partially surrounding an inner portion of the wafer.

In one or more embodiments, the ring structure may be enclosing the inner portion of the wafer.

In one or more embodiments, the ring structure may be a circular ring structure.

In one or more embodiments, the ring structure may be a Taiko ring structure.

In one or more embodiments, the protruding structure may have a height of less than or equal to a starting thickness of the wafer, for example in the range from about 200 μm to about 800 μm.

In one or more embodiments, the protruding structure may be disposed at a backside of the wafer.

In one or more embodiments, the wafer support ring may include a plurality of claw protrusions formed circumferentially around the wafer support ring and angularly spaced from one another.

In one or more embodiments, the claw protrusions may be regularly angularly spaced from one another.

In one or more embodiments, the wafer may include a plurality of engagement protrusions into which the claw protrusions can engage, wherein the engagement protrusions are formed circumferentially around the wafer and are angularly spaced from one another. The engagement protrusions may be arranged so that the claw protrusions can be axially inserted between the claw protrusions.

In one or more embodiments, the engagement protrusions may be regularly angularly spaced from one another.

In one or more embodiments, the claw protrusions are configured to engage into the engagement protrusions in a manner so that the claw protrusions and the engagement protrusions radially overlap.

In one or more embodiments, the claw protrusions may protrude radially inwardly and the engagement protrusions may protrude radially outwardly, or vice versa.

In one or more embodiments, the protruding structure may include the engagement protrusions.

In one or more embodiments, the number of engagement protrusions may be the same as the number of claw protrusions.

In one or more embodiments, the engagement protrusions may include a receiving portion, and the claw protrusions may include a protruding portion that matches the receiving portion. In one or more embodiments, the receiving portion may include or may be a recess. In one or more embodiments, the receiving portion may include or may be an inverse wedge-shaped recess and the protruding portion may include or may be a wedge-shaped protrusion.

In one or more embodiments, the engagement protrusions may include a blocking portion that is configured to block rotation of the wafer support ring.

In one or more embodiments, the wafer support ring and the wafer may be configured to adhere to one another through magnetic force (magnetic adhesion).

In one or more embodiments, the wafer may include or may be made from a first magnetic material and the wafer support ring may include or may be made from a second magnetic material. The second magnetic material may be the same material as the first magnetic material, or they may be different materials.

A wafer arrangement in accordance with various embodiments may include: a wafer including a ring structure disposed at an edge region of the wafer and at least partially surrounding an inner portion of the wafer, wherein the ring structure includes a plurality of engagement protrusions arranged circumferentially around the ring structure and angularly spaced from one another; and a wafer support ring including a plurality of claw protrusions arranged circumferentially around the wafer support ring and angularly spaced from one another, wherein the claw protrusions are configured to engage into the engagement protrusions so as to attach the wafer support ring to the wafer.

In one or more embodiments, the wafer may include or may be made from silicon, and the wafer support ring may include or may be made from at least one of alkaline free glass, borosilicate glass, molybdenum, silicon, or a combination of two or more of the aforementioned materials.

A method for processing a wafer in accordance with various embodiments may include: providing a wafer and a wafer support ring; and subsequently attaching the wafer support ring to the wafer.

In one or more embodiments, the method may further include applying at least one of a wafer processing step and a wafer handling step to the wafer while the wafer support ring is attached to the wafer.

In one or more embodiments, the method may further include detaching the wafer support ring from the wafer after the wafer support ring has been attached to the wafer, for example after the at least one of the wafer processing step and the wafer handling step has been carried out.

In one or more embodiments, attaching the wafer support ring to the wafer may include attaching the wafer support ring to a back side of the wafer.

In one or more embodiments, attaching the wafer support ring to the wafer may include attaching the wafer support ring to a protruding structure, e.g. a ring structure, e.g. a Taiko ring, of the wafer.

In one or more embodiments, attaching the wafer support ring to the wafer may include bringing the wafer and the wafer support ring into mechanical contact with one another and then moving at least one of the wafer and the wafer support ring relative to one another.

In one or more embodiments, moving at least one of the wafer and the wafer support ring relative to one another may include rotating at least one of the wafer and the wafer support ring relative to one another about an axis that is perpendicular to a main processing surface of the wafer.

In one or more embodiments, attaching the wafer support ring to the wafer may include attaching the wafer support ring to the wafer by a twistlock mechanism.

In one or more embodiments, the wafer support ring may include a plurality of claw protrusions and the wafer may include a plurality of engagement protrusions into which the claw protrusions can engage, wherein by means of rotating at least one of the wafer and the wafer support ring relative to one another the claw protrusions overlap the engagement protrusions.

In one or more embodiments, the wafer support ring may include a plurality of claw protrusions formed circumferentially around the wafer support ring and angularly spaced from one another, and the wafer may include a plurality of engagement protrusions into which the claw protrusions can engage, wherein the engagement protrusions are formed circumferentially around the wafer and are angularly spaced from one another so that the claw protrusions can be axially inserted between the engagement protrusions, wherein attaching the wafer support ring to the wafer may include axially inserting the claw protrusions of the wafer support ring between the engagement protrusions of the wafer and subsequently rotating at least one of the wafer and the wafer support ring relative to one another so that the claw protrusions and the engagement protrusions radially overlap.

A wafer in accordance with various embodiments may include: a plurality of engagement protrusions formed circumferentially around the wafer and angularly spaced from one another.

In one or more embodiments, the engagement protrusions may protrude radially outwardly.

In one or more embodiments, the engagement protrusions may protrude radially inwardly.

In one or more embodiments, the wafer may include a protruding structure at an edge region of the wafer, wherein the protruding structure may include the engagement protrusions.

In one or more embodiments, the protruding structure may be a ring structure at least partially surrounding an inner portion of the wafer.

In one or more embodiments, the ring structure may be enclosing the inner portion of the wafer.

In one or more embodiments, the ring structure may be a circular ring structure.

In one or more embodiments, the ring structure may be a Taiko ring structure.

In one or more embodiments, the protruding structure may have a height of less than or equal to a starting thickness of the wafer.

In one or more embodiments, the protruding structure may have a height in the range from about 200 µm to about 800 µm.

In one or more embodiments, the protruding structure may be disposed at a backside of the wafer.

In one or more embodiments, the protruding structure may include a plurality of separated segments.

In one or more embodiments, the protruding structure may include a plurality of slits cutting through the protruding structure.

A wafer support ring in accordance with various embodiments may include: a plurality of claw protrusions formed circumferentially around the wafer support ring and angularly spaced from one another.

In one or more embodiments, the claw protrusions may protrude radially inwardly.

In one or more embodiments, the claw protrusions may protrude radially outwardly.

In one or more embodiments, the wafer support ring may include or may be made from at least one material selected from a group of materials, the group consisting of: alkaline free glass, borosilicate glass, molybdenum, silicon, or a combination of two or more of the aforementioned materials.

In one or more embodiments, the wafer support ring may have a thickness in the range from about 100 µm to about 2000 µm.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A wafer arrangement, comprising:
   a wafer; and
   a wafer support ring,
   wherein the wafer and the wafer support ring are configured to be releasably coupled to one another so that the wafer support ring can be uncoupled from the wafer without causing damage to the wafer or the wafer support ring,
   wherein the wafer comprises a first set of coupling members and the wafer support ring comprises a second set of coupling members corresponding to the first set of coupling members, wherein the first set of coupling members and the second set of coupling members are configured to be releasably coupled.

2. The wafer arrangement of claim 1, wherein the wafer and the wafer support ring are configured to be releasably coupled to one another by magnetic coupling, electrostatic coupling, adhesive coupling, or mechanical coupling.

3. The wafer arrangement of claim 2, wherein the wafer arrangement comprises one wafer and one wafer support ring.

4. The wafer arrangement of claim 3, wherein the wafer and the wafer support ring have approximately the same diameter.

5. The wafer arrangement of claim 3, wherein the wafer support ring comprises a first material and the wafer comprises a second material, wherein the first material and the second material have at least substantially the same coefficient of thermal expansion.

6. The wafer arrangement of claim 3, wherein the wafer support ring comprises at least one material selected from a group of materials, the group consisting of: alkaline free glass, borosilicate glass, molybdenum, silicon, or a combination of two or more of the aforementioned materials.

7. The wafer arrangement of claim 3, wherein the wafer support ring is rigid and has a thickness in the range from about 100 µm to about 2000 µm, thereby providing mechanical stability during processing of the wafer.

8. The wafer arrangement of claim 1, wherein the wafer has a first side and a second side opposite the first side, wherein the wafer support ring is provided on the second side of the wafer, and wherein the wafer and the wafer support ring are configured to be reversibly mechanically coupled to one another, wherein the wafer and the wafer support ring are rotatable with respect to one another about a common axis that is perpendicular to the first and second sides of the wafer.

9. The wafer arrangement of claim 8, wherein the first set of coupling members and the second set of coupling members are configured to be mechanically engaged when at least one of the wafer and the wafer support ring is rotated in a locking direction with respect to one another to a locked position and the first set of coupling members and the second set of coupling members are configured to be mechanically disengaged when at least one of the wafer and the wafer support ring is rotated in an opposite unlocking direction with respect to one another to an unlocked position.

10. The wafer arrangement of claim 9, wherein the first set of coupling members comprise a set of engagement protrusions disposed circumferentially around the wafer and the second set of coupling members comprise a set of claw protrusions disposed circumferentially around the wafer support ring.

11. The wafer arrangement of claim 9, wherein the wafer further comprises a protruding structure at an edge region of the second side of the wafer.

12. The wafer arrangement of claim 11, wherein the protruding structure is a ring structure at least partially surrounding an inner region of the second side of the wafer.

13. The wafer arrangement of claim 11, wherein the wafer is a monolithic structure, wherein the protruding structure is formed by removing semiconductor material from an inner region of the second side of the wafer and the protruding structure has a height of less than or equal to about a starting thickness of the wafer.

14. The wafer arrangement of claim 11, wherein the protruding structure comprises the first set of coupling members.

15. The wafer arrangement of claim 1, wherein the first set of coupling members and the second set of coupling members contain magnetic material and are configured to be magnetically engaged.

16. The wafer arrangement of claim 1, wherein the first set of coupling members and the second set of coupling members include releasable adhesive material and are configured to be adhesively engaged.

17. The wafer arrangement of claim 1,
wherein the wafer has an edge, a top side, and a bottom side opposite the top side and the first set of coupling members is provided only on the bottom side of the wafer,
wherein the wafer support ring has a top side and a bottom side opposite the top side, and the second set of coupling members is provided only on the top side of the wafer support ring,
wherein the wafer support ring is rigid and provided only on the bottom side of the wafer so that the top side of the wafer support ring faces the bottom side of the wafer, and
wherein the bottom side of the wafer and the top side of the wafer support ring are configured to be fastened to one another by magnetic coupling, electrostatic coupling, adhesive coupling, or mechanical coupling.

18. The wafer arrangement of claim 1, wherein the wafer and the wafer support ring are configured to be rotatable with respect to one another, wherein the first set of coupling members comprises a plurality of first coupling members and the second set of coupling members comprises a plurality of second coupling members, wherein when the wafer and/or the wafer support ring are rotated in a first direction with respect to one another the plurality of first coupling members and the plurality of second coupling members become engaged with one another.

19. The wafer arrangement of claim 18, wherein when the wafer and/or the wafer support ring are rotated in a second direction with respect to one another which is opposite the first direction the plurality of first coupling members and the plurality of second coupling members become disengaged from one another.

20. The wafer arrangement of claim 18, wherein the wafer is a single wafer having a first side and a second side opposite the first side, wherein the wafer support ring is a single wafer support ring provided on the second side of the wafer, wherein the wafer further comprises an annular structure disposed at an edge region of the second side of the wafer and at least partially surrounds an inner region of the second side of the wafer, wherein the annular structure comprises the plurality of first coupling members arranged circumferentially around the annular structure and angularly spaced from one another; and wherein the wafer support ring comprises the plurality of second coupling members arranged circumferentially around the wafer support ring and angularly spaced from one another, wherein the plurality of second coupling members are configured to engage the plurality of first coupling members so as to releasably fasten the wafer support ring to the wafer when the wafer and the wafer support ring are rotated in the first direction with respect to one another to a locking position and the plurality of second coupling members are configured to disengage the plurality of first coupling members so as to unfasten the wafer support ring from the wafer when the wafer and the wafer support ring are rotated in the second direction with respect to one another to an unlocking position.

* * * * *